United States Patent [19]

Iwahara

[11] 4,137,510

[45] Jan. 30, 1979

[54] FREQUENCY BAND DIVIDING FILTER

[75] Inventor: Makoto Iwahara, Sagamihara, Japan

[73] Assignee: Victor Company of Japan, Ltd., Yokohama, Japan

[21] Appl. No.: 888,561

[22] Filed: Mar. 20, 1978

Related U.S. Application Data

[63] Continuation-in-part of Ser. No. 760,956, Jan. 21, 1977, abandoned.

[30] Foreign Application Priority Data

| Jan. 22, 1976 | [JP] | Japan | 51-6108 |
| May 24, 1977 | [JP] | Japan | 52-60089 |
| May 24, 1977 | [JP] | Japan | 52-60091 |

[51] Int. Cl.² .................................. H03H 7/46
[52] U.S. Cl. .................... 333/6; 328/139; 328/167; 330/126
[58] Field of Search ............ 307/233 R; 324/77 D, 324/77 E, 77 B; 328/139, 167, 137; 330/126; 333/6

[56] References Cited

U.S. PATENT DOCUMENTS

| 2,651,673 | 9/1953 | Fredendall | 333/6 UX |
| 2,760,011 | 8/1956 | Berry | 333/6 UX |
| 2,851,661 | 9/1958 | Buland | 333/6 X |
| 3,207,854 | 9/1965 | Johnson | 330/126 X |
| 3,590,284 | 6/1971 | Yamane | 328/165 X |
| 3,769,611 | 10/1973 | Scaggs | 330/126 X |

*Primary Examiner*—Paul L. Gensler
*Attorney, Agent, or Firm*—Haseltine, Lake & Waters

[57] ABSTRACT

A frequency band dividing filter comprises at least two unit circuits connected in cascade connection of at least two stages, and at least one supplemental delay circuit. Each of the unit circuits comprises a low-pass filter having a specific filtering frequency band with a steep cut-off characteristic, a delay circuit connected in parallel with said low-pass filter and having a frequency phase characteristic substantially equal to the frequency phase characteristic of said low-pass filter in the pass band thereof, and a subtraction circuit connected to the output sides of said low-pass filter and said delay circuit thereby to carry out subtraction of the outputs of said low-pass filter and said delay circuit. The supplemental delay circuit is connected in parallel with the second stage unit circuit, which is connected to the first stage unit circuit in cascade connection, and has the same characteristic as the characteristic of the delay circuit of the second stage unit circuit.

12 Claims, 40 Drawing Figures

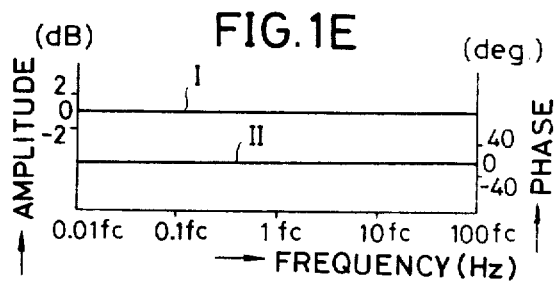
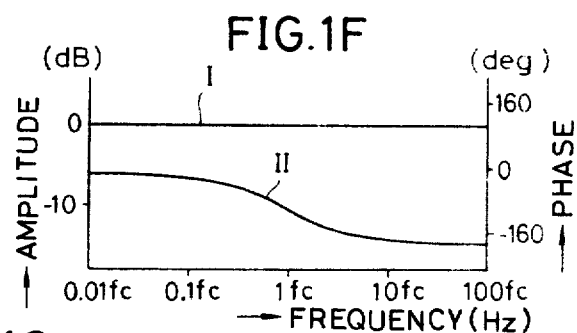
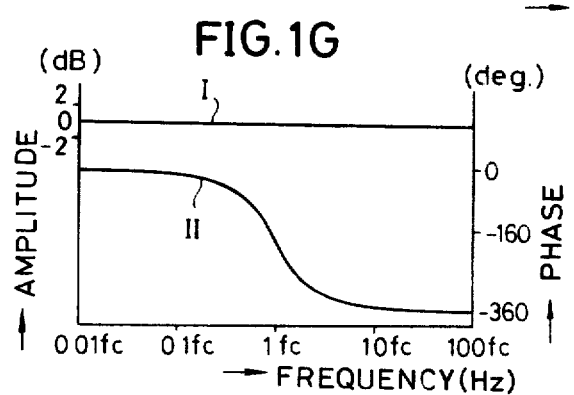
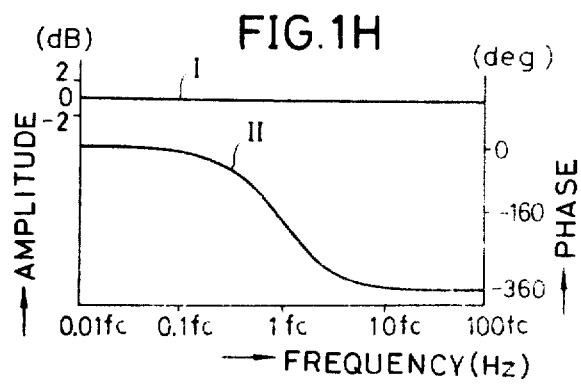

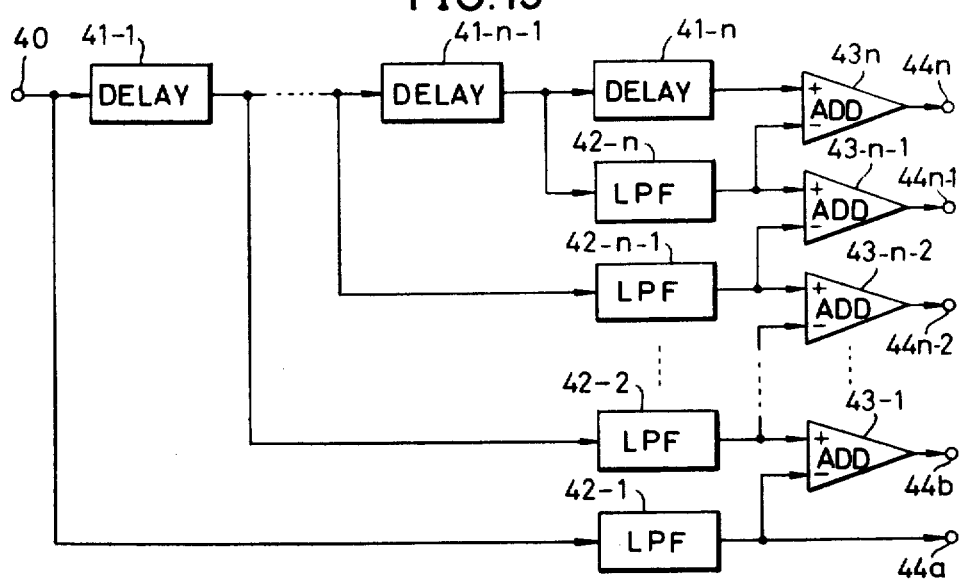
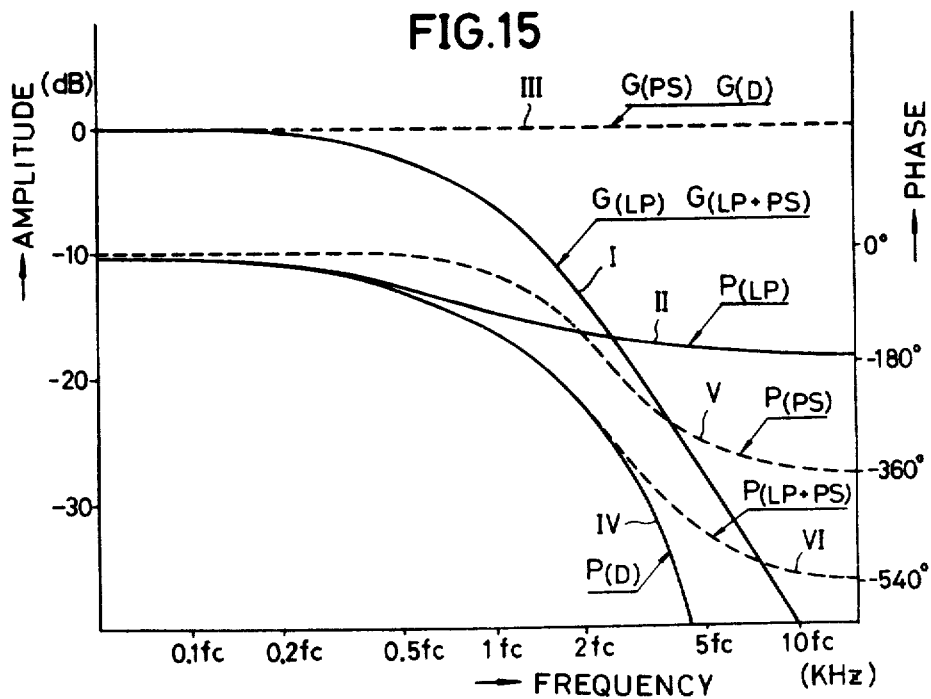

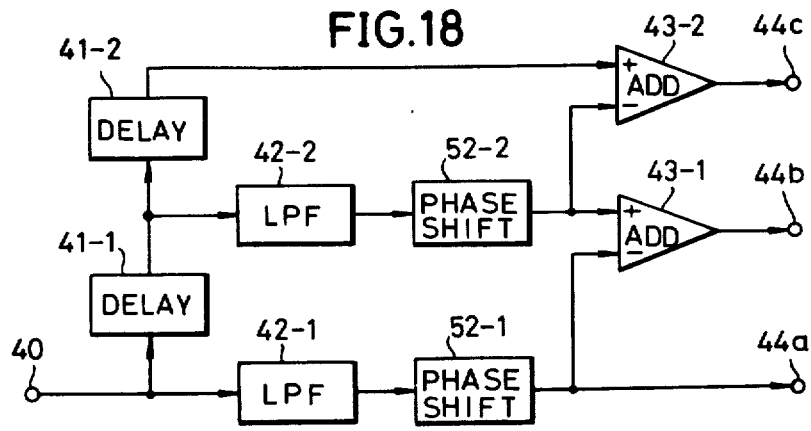
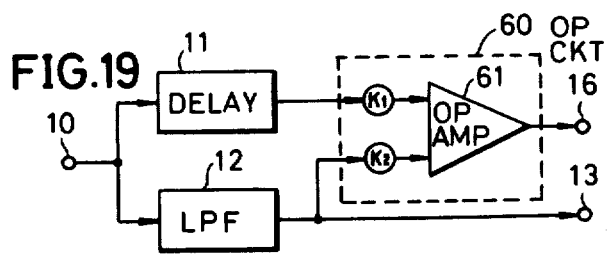
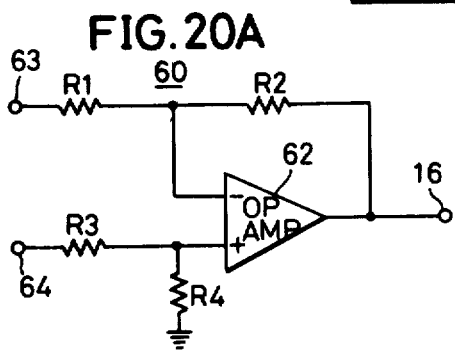
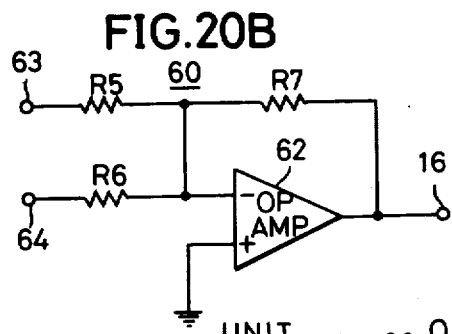
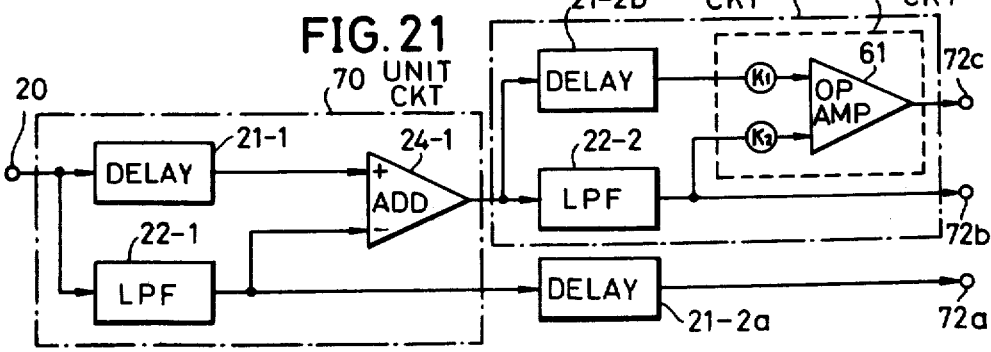

FREQUENCY BAND DIVIDING FILTER

BACKGROUND OF THE INVENTION

The present application is a continuation-in-part application of U.S. patent application Ser. No. 760,956 "FREQUENCY BAND DIVIDING FILTER" filed on Jan. 21, 1977 now abandoned.

This invention relates generally to frequency band dividing fliters, and more particularly to a filter for the operation of frequency band dividing an input signal into band divided signals and then combining these signals into a combined signal, which filter operates to divide the input signal into a plurality of frequency band signals in a manner such that both the frequency amplitude characteristic and the frequency delay characteristic of the resulting combined signal will be flat.

In general, in a system such as an audio speaker system, there is a system in which speakers respectively for low, medium, and high frequency bands (hereinafter referred to as low, medium, and high bands), for example, are used, and an audio signal is divided into low, medium, and high bands, signals of the bands thus divided being supplied to the speakers for the respectively corresponding bands. For this band division, a frequency band dividing filter is used. In this case, the listener hears sounds resulting from the acoustical combination in the sound field of sounds reproduced by the speakers for the three bands. Furthermore, a system for dividing in this manner a signal into frequency bands, transmitting the signals thus divided through transmission systems respectively for the bands, and thereafter again adding and combining the signals thus transmitted thereby to obtain transmitted signals is being used also in systems such as a limiter or a noise reduction system.

In such cases, it is desirable that the characteristics of the signal obtained after being frequency band divided, transmitted, and then added and combined are equal to the characteristics of the signal prior to the frequency band division. Accordingly, a band dividing filter for accomplishing the above described frequency band division is required to have a sharp or steep cut-off characteristic and a frequency amplitude characteristic (hereinafter referred to as "amplitude characteristic") and a frequency delay characteristic (hereinafter referred to as "delay characteristic") such that the amplitude characteristic and the delay characteristic of the signal after adding and combining will respectively become flat.

However, in a typical frequency band dividing filter known heretofore, as hereinafter illustrated by an example with reference to a drawing, if any of the above mentioned cut-off characteristic, amplitude characteristic, and delay characteristic is as desired, the others are poor, and there have been none in which all of these characteristics are fully satisfactory.

SUMMARY OF THE INVENTION

Accordingly, it is a general object of the present invention to provide a novel and useful frequency band dividing filter in which the above described difficulty has been overcome.

Another and specific object of the invention is to provide a frequency band dividing filter having a steep cut-off characteristic and an amplitude characteristic and a group delay characteristic such that the amplitude characteristic and the group delay characteristic of a signal obtained by being divided into three or more frequency bands and combined will be respectively flat.

Still another object of the invention is to provide a frequency band dividing filter having desirable characteristics and being capable of dividing a signal into three or more frequency bands, with a simple circuit organization in which only low-pass filters, delay circuits, an substraction circuits and an additional filter or filters are used.

A further object of the invention is to provide a frequency band dividing filter of an organization wherein a phase-shifting circuit is provided in a signal transmission path containing the above mentioned low-pass filter so that the phase characteristics respectively of a signal transmission path containing the above mentioned delay circuit and the above mentioned signal transmission path containing the low-pass filter will become equal.

Still further object of the invention is to provide a frequency band dividing filter comprising a delay circuit, a low-pass filter, and a coefficient-applying operation circuit for multiplying the output signals respectively of the delay circuit and the low-pass filter with respective coefficients and thus carrying out an operation thereon. Even when the amplitude characteristic of the low-pass filter and the amplitude characteristic of the delay circuit in the pass band of the low-pass filter are not equal, the amplitude characteristics respectively of signals which have passed through the low-pass filter and the delay circuit are unified in the operation circuit and thus subjected to the operation.

Other objects and further features of the invention will be apparent from the following detailed description with respect to preferred embodiments of the invention when read in conjunction with the accompanying drawings.

BRIEF DESCRIPTION OF THE DRAWINGS

FIGS. 1A through 1D and FIGS. 1E through 1H are graphs respectively indicating the amplitude characteristics and phase characteristics of a high-pass filter and low-pass filter of general type;

FIGS. 11, 12 and 13 are schematic block diagrams respectively showing the general organizations of fourth, fifth, and sixth embodiments of the frequency band dividing filter according to the invention;

FIG. 15 is a graph indicating the amplitude and phase characteristics of the delay circuit, low-pass filter, and phase-shifting circuit in the block diagram shown in FIG. 14;

FIGS. 17 and 18 are schematic block diagrams respectively showing the general organization of eighth and ninth embodiments of the frequency band dividing filter according to the invention;

FIG. 19 is a schematic block diagram showing the general organization of a tenth embodiment of the frequency band dividing filter according to the invention;

FIGS. 20A and 20B are circuit diagrams respectively showing specific examples of circuit arrangement of the coefficient applying operation circuit in the filter shown in FIG. 19; and FIGS. 21 through 25 are schematic block diagrams respectively showing the general organization of eleventh through fifteenth embodiments of the frequency band dividing filter according to the invention.

DETAILED DESCRIPTION

Examples of conbinations of the transfer characteristics of a high-pass filter and a low-pass filter of general type of a characteristic such that a signal obtained by combining signals which have passed through the filters has a flat amplitude characteristic and of the transfer characteristic of the combined signal are set forth in the following table.

1D, the curves 1H and 1L respectively indicate the amplitude characteristics of the high-pass and low-pass filters, while the curves IIH and IIL respectively indicate the phase characteristics of the high-pass and low-pass filters. In each of FIGS. 1E through 1H, the straight line 1 indicates the amplitude characteristic of a signal obtained from combining signals which have passed through the filters, while the line II indicates the phase characteristic of the combined signal. In each of these figures, the abscissa represents frequency in terms of multiples with the crossover frequency fc taken as one (unity), and the left-hand and right-hand ordinates respectively represent amplitude and phase.

Figure 1A:
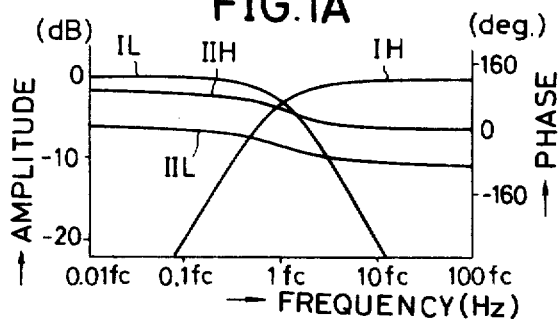

Then, when signals which have passed through high-pass and low-pass filters of, for example, the characteristics indicated in FIG. 1A are combined with the same polarity, the amplitude characteristic and the phase characteristic of the resulting combined signal to the input signal are flat as indicated in FIG. 1E. Accordingly, by connecting in cascade or series connection high-pass and low-pass filters of characteristics as indicated in FIG. 1A, a frequency band dividing filter of flat group delay characteristic is obtained. However, as is apparent from the curves IH and IL in FIG. 1A, the cut-off characteristics of the two filters are gentle and bad and, therefore, are not practical.

Figure 1B:
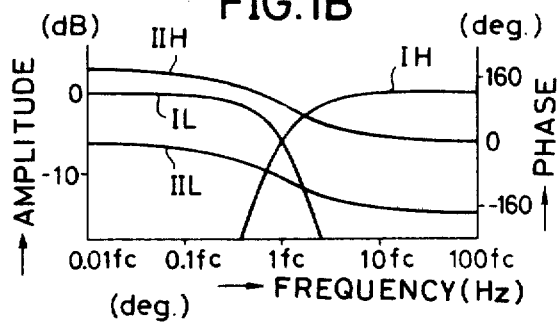
Figure 1C:
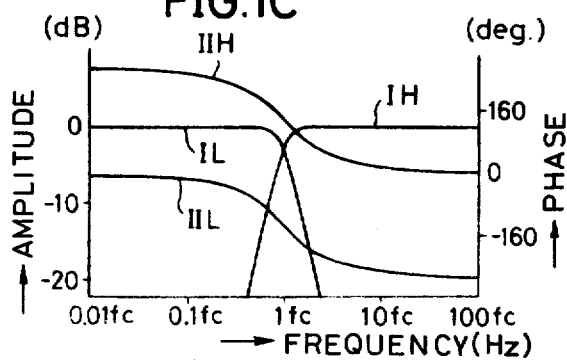
Figure 1D:
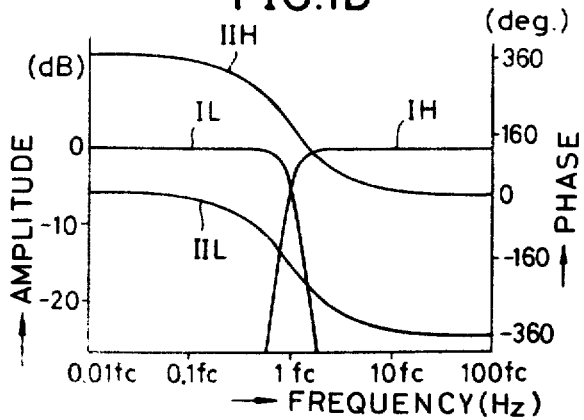

When filters of steep cut-off characteristics as indicated in FIGS. 1B, 1C, and 1D ar used, the phase characteristics of the combined signals become as indicated in FIGS. 1F, 1G, and 1H, and the group delay characteristics do not become flat.

Therefore, through the use of known high-pass and low-pass filters, a frequency band dividing filter wherein the cut-off characteristic is steep and, moreover, the amplitude characteristic and the phase characteristic of the combined signal are flat could not be realized.

Furthermore, among the known frequency band dividing filters, there has been one wherein a high-pass filter or a low-pass filter and a subtractor for obtaining the difference between the input and the output of this filter are used. However, because the phase characteris-

| | | | After combining | |
|---|---|---|---|---|
| | Low-pass filter side | High-pass filter side | Same Polarity | High-pass filter side reverse polarity |
| 6dB/oct | $\dfrac{1}{1 + Ts}$ | $\dfrac{Ts}{1 + Ts}$ | 1 | $\dfrac{1 - Ts}{1 + Ts}$ |
| Characteristic 12dB/oct | $\dfrac{1}{(1 + Ts)^2}$ a | $\dfrac{(Ts)^2}{(1 + Ts)^2}$ | e | $\dfrac{1 - Ts}{1 + Ts}$ f |
| Characteristic 18dB/oct | $\dfrac{1}{(1 + Ts)\{1 + Ts + (Ts)^2\}}$ b | $\dfrac{(Ts)^3}{(1 + Ts)\{1 + Ts + (Ts)^2\}}$ | $\dfrac{1 - Ts + (Ts)^2}{1 + Ts + (Ts)^2}$ | $\dfrac{1 - Ts}{1 + Ts}$ f |
| Characteristic 24dB/oct | $\dfrac{1}{\{1 + \sqrt{2}\,Ts + (Ts)^2\}^2}$ c | $\dfrac{(Ts)^4}{\{1 + \sqrt{2}\,Ts + (Ts)^2\}^2}$ | $\dfrac{1 - \sqrt{2}\,Ts + (Ts)^2}{1 + \sqrt{2}\,Ts + (Ts)^2}$ g | f |
| Characteristic | d | | | h | where $Ts = 1/fc$, and fc is the cross-over frequency of the high pass and low-pass filters.

Figure 2:
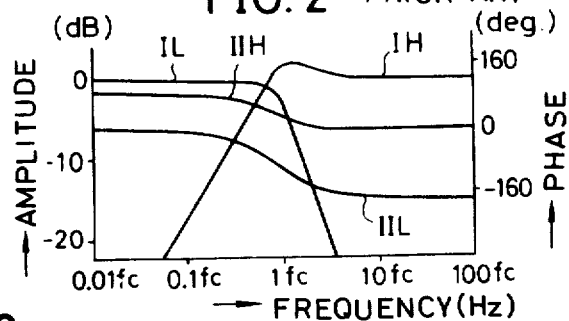
FIG. 2 is a graph indicating the amplitude characteristic and the phase characteristic of one example of a known frequency band dividing filter.

The characteristics corresponding to the reference characters a through h shown in the characteristic spaces in the above table are respectively indicated in FIGS. 1A through 1H. In each of FIGS. 1A through tic of the above mentioned high-pass or low-pass filter is not flat, subtraction between signals of different phases is carried out in the subtractor. As a consequence, as indicated in FIG. 2, a high peak exists particularly in the high-pass filtering amplitude characteristic IH, and there have been other problems such as a cut-off characteristic which is gentle. In this connection the example of characteristics indicated in FIG. 2 corresponds to the case wherein a Butterworth filter having a cut-off characteristic of 12 dB/oct is used as the above mentioned low-pass filter.

Accordingly, in accordance with the present invention, there is provided a frequency band dividing filter having characteristic such that the cut-off characteristic is steep, and a combined signal of flat amplitude and phase characteristics can be obtained.

Figure 3:
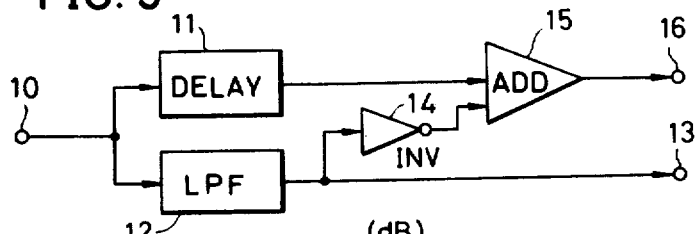
FIG. 3 is a block schematic diagram showing the general organization of a fundamental unit circuit which is employed in a frequency band dividing filter according to the present invention.

A fundamental unit circuit which is employed in the frequency band dividing filter according to the invention as illustrated in FIG. 3, an audio signal applied to an input terminal 10 is supplied to a delay circuit 11 and a low-pass filter 12. As a result of being filtered by the low-pass filter 12, a signal of a specific frequency band is produced and, on one hand, is led out as an output low band signal from an output terminal 13. This signal, on the other hand, is supplied to an inverter 14, where it is phase inverted and is then supplied to an adder 15.

The signal which has been delayed a specific time by the delay circuit 11 is supplied to the adder 15 and there added to the above mentioned low band signal which has been phase inverted. As a result, a high band signal is produced as output from the adder 15 and led out through an output terminal 16.

The transmission characteristic LP of the low-pass filter 12 is set, for example, as $LP = 1/(1 + Ts)^2$, and as is apparent from the table set forth hereinbefore and FIG. 1B, this filter is a low-pass filter of relatively good cut-off characteristic.

Figure 4:
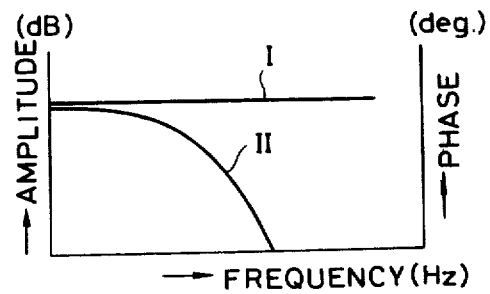
FIG. 4 is a graph indicating the amplitude characteristic and the phase characteristic of a delay circuit used in the filter of the invention.

The amplitude and phase characteristics of the delay circuit 11 are set to be substantially the same as the amplitude and phase characteristics of the pass band of the low-pass filter 12 as respectively indicated by lines I and II in FIG. 4. As is apparent from FIG. 1B, the phase characteristic in the flat pass band of the amplitude characteristic of the low-pass filter 12 varies linearly. Accordingly, the group delay characteristic (obtained by differentiating the phase characteristic with respect to frequency) in this frequency band can be considered to be flat. On one hand, the group delay characteristic of the delay circuit 11 is flat, and the phase characteristic $\phi$ is expressed by $\phi = -2\pi\tau f$, where $\tau$ is the delay time, and f is the frequency. Therefore, by appropriately selecting the delay time $\tau$, the characteristic of the delay circuit 11 can be set to be substantially the same as the phase characteristic of the low-pass filter 12.

The amplitude and group delay characteristics of a signal obtained by combining the output low band and high band signals led out through the output terminals 13 and 16 in FIG. 3 will now be considered. In FIG. 3, the characteristic of the signal led out through the output terminal 13 is LP, and the characteristic of the signal led out from the inverter 14 is −LP. The signal having a characteristic D which has passed through the delay circuit 11 and the signal of the characteristic −LP are added in the adder 15, and a signal of the resulting characteristic (D − LP) is led out through the output terminal 16.

When the signal of the characteristic LP from the output terminal 13 and the signal of the characteristic (D − LP) from the output terminal 16 are combined, the characteristic of the combined signal becomes $LP + (D − LP) = D$. Thus, the characteristic of the combined signal is represented by only the characteristic D of the delay circuit 11, whose amplitude characteristic and group delay characteristic are both flat, and is unrelated to the characteristic LP of the low-pass filter 12. Therefore, no matter what characteristic the low-pass filter used for the filter 12 has, a combined signal whose amplitude and group delay characteristics are both flat will be obtained.

Furthermore, in the adder 15, subtraction of the signal of the characteristic D and the signal of the characteristic LP of substantially the same mutual phase is carried out. Accordingly, subtraction is accomplished with higher accuracy than in the case of subtraction between signals of different phase as in the example of prior art. For this reason, the amplitude characteristics of the output signals obtained from the output terminals 13 and 16 are as indicated by the curves IIIL and IIIH in FIG. 5. As will be apparent from a comparison with the characteristics of a known frequency band dividing filter as indicated by broken-line curves IL and IH in the same FIG. 5, the cut-off characteristic of the amplitude characteristic of particularly the high band signal obtained from the output terminal 16 is much steeper and, moreover, does not produce a peak.

Figure 5:
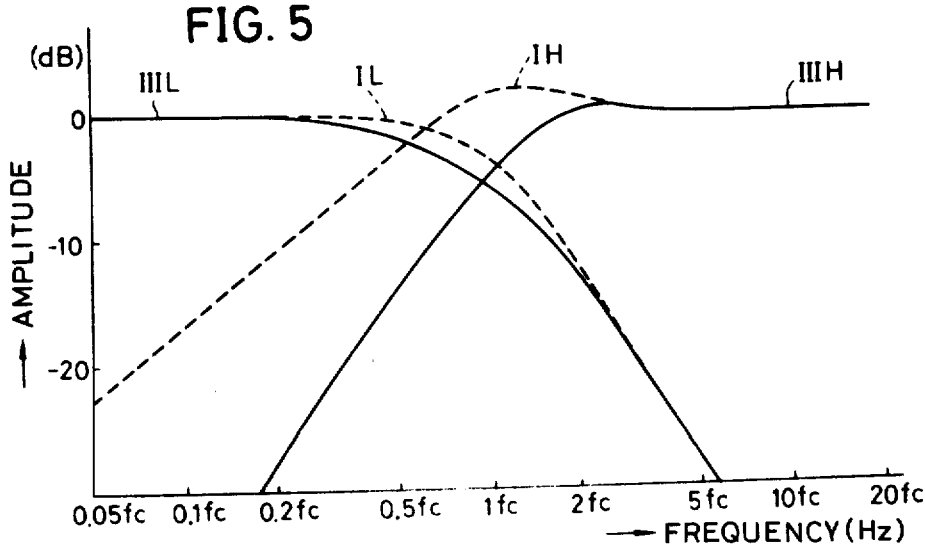
FIG. 5 is a graph indicating the amplitude characteristic of the output signal of the filter of the invention illustrated in FIG. 3.

The delay circuit 11 of a practical example of a frequency band dividing filter producing as output a signal of the characteristic indicated by full-line curves IIIL and IIIH in FIG. 5 is adapted to have a gain of one (unity) and a delay time $\tau$ of $0.35/fc = 0.7\pi T$(sec.).

Figure 6:
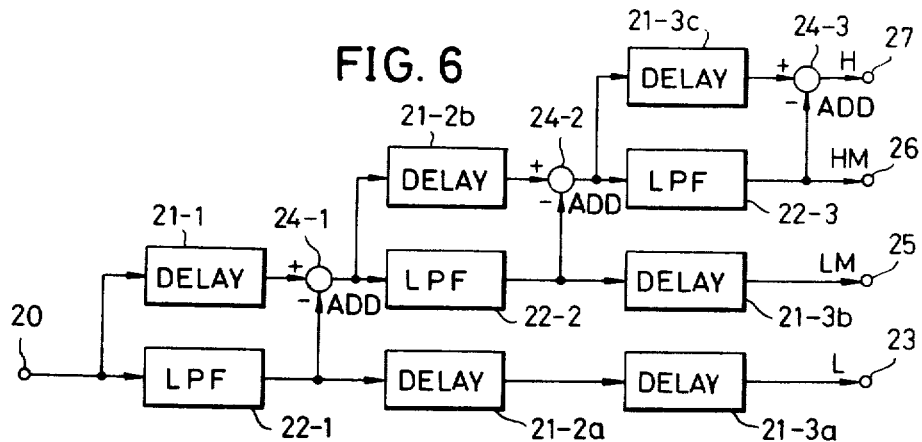
FIG. 6 is a schematic block diagram showing the general organization of a first embodiment of the frequency band dividing filter according to the invention.

A first embodiment of the frequency band dividing filter according to the invention, in which the above described unit circuits are employed, is illustrated in FIG. 6. An audio signal applied to an input terminal 20 is supplied to a delay circuit 21-1 and a low-pass filter 22-1. The resulting low band signal filter by the low-pass filter 22-1 passes, on one hand, through supplemental delay circuits 21-2a and 21-3a and is led out as an output low band signal through an output terminal 23. The output signal of the low-pass filter 22-1, on the other hand, is supplied with inverted phase to an adder 24-1.

The signal which has been delayed a specific time by the delay circuit 21-1 is supplied to the adder 24-1 and there added with the phase inverted signal from the low-pass filter 22-1. The resulting output signal of the adder 24-1 is supplied to a delay circuit 21-2b and a low-pass filter 22-2. The signal filtered by the low-pass filter 22-2 is a signal of medium-low band, which passes through a supplemental delay circuit 21-3b and is led out as an output medium-low band signal through output terminal 25.

The output of the low-pass filter 22-2 is phase inverted and supplied to an adder 24-2, where it is added to the signal from the delay circuit 21-2b. The output signal of the adder 24-2 is supplied to a delay circuit 21-3c and a low-pass filter 22-3. The filtered output of the low-pass filter 22-3 is a medium-high band signal, which, on one hand, is led out as an output medium-high band signal through an output terminal 26. The output signal of the low-pass filter 22-3, on the other hand, is phase inverted and supplied to an adder 24-3 and there added to the signal from the delay circuit 21-3c. The output signal of the adder 24-3 is led out as an output high band signal through an output terminal 27.

Of the reference numerals designating the blocks of the delay circuits and low-pass filters in FIG. 6, those with the same appended numeral joined thereto by hyphen designate a group constituting a frequency band dividing filter for division into two bands wherein the combined amplitude and group delay characteristics are both flat.

Here, the characteristics of the low-pass filters 22-1, 22-2, and 22-3 are respectively set as LP1, LP2, and LP2, and the cut-off characteristics thereof are steep. Furthermore, the characteristics of the delay circuit 21-1, delay circuits 21-2a and 21-2b, and delay circuits 21-3a, 21-3b, and 21-3c are respectively set as D1, D2 and D3 and the amplitude characteristics and phase characteristics thereof are respectively set to be substantially the same as the amplitude characteristics and phase characteristics in the pass bands of the low-pass filters of the respectively same appended reference numerals, thereby being set to have flat group delay characteristics.

Next, the amplitude characteristic and the group delay characteristic of a signal obtained by combining output low band, medium-low band, medium-high band, and high band signals obtained from the output terminals 23, 25, 26 and 27 will be described.

Figure 7A:
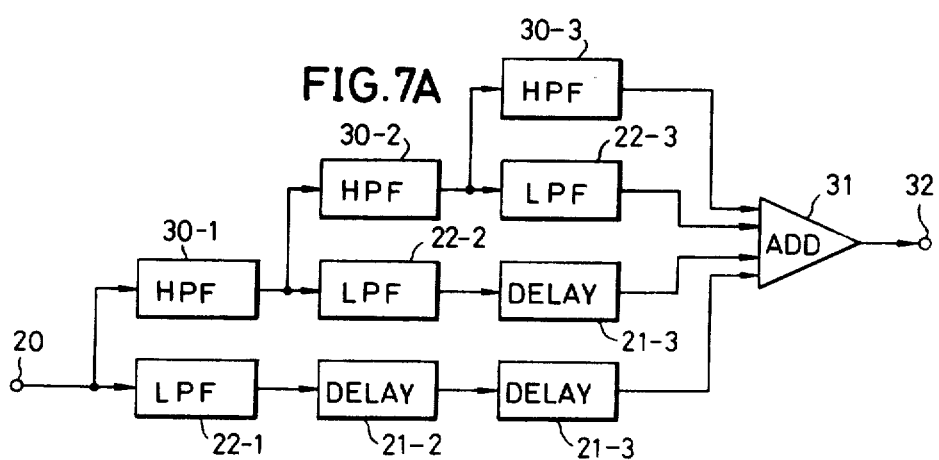
FIGS. 7A through 7F are schematic block diagrams of equivalent block organization of the block system of FIG. 6.

A block diagram equivalent to the block diagram illustrated in FIG. 6 is shown in FIG. 7A. In FIG. 7A, a high-pass filter 30-1 has a characteristic (D1 − LP1) which is the result of adding the characteristic −LP1 which is obtained by phase inverting the characteristic of the low-pass filter 22-1 and the characteristic D1 of the delay circuit 21-1. Another high-pass filter 30-2 has a characteristic (D2 − LP2) which results from the addition of the characteristic −LP2 obtained by phase inverting the characteristic of the low-pass filter 22-2 and the characteristic D2 of the delay circuit 21-2. Still another high-pass filter 30-3 has a characteristic (D3 − LP3) resulting from the addition of a characteristic −LP3 obtained by phase inverting the characteristic of the low-pass filter 22-3 and the characteristic D3 of the delay circuit 21-3. The outputs of the high-pass filter 30-3, the low-pass filter 22-3, and the delay circuits 21-3a and 21-3b are added and combined in an adder 31, and the resulting combined signal is led out through an output terminal 32. This signal obtained from the output terminal 32 is equivalent to the signal obtained by combining the output signals of the output terminals 23, 25, 26 and 27 in FIG. 6.

In FIG. 7A, when the characteristic (D3 − LP3) of the high-pass filter 30-3 and the characteristic LP3 of the low-pass filter 22-3 are added, the result is D3, which is the characteristic of the delay circuit 21-3. Accordingly, the block system shown in FIG. 7A can be equivalently represented as in FIG. 7B.

Figure 7B:
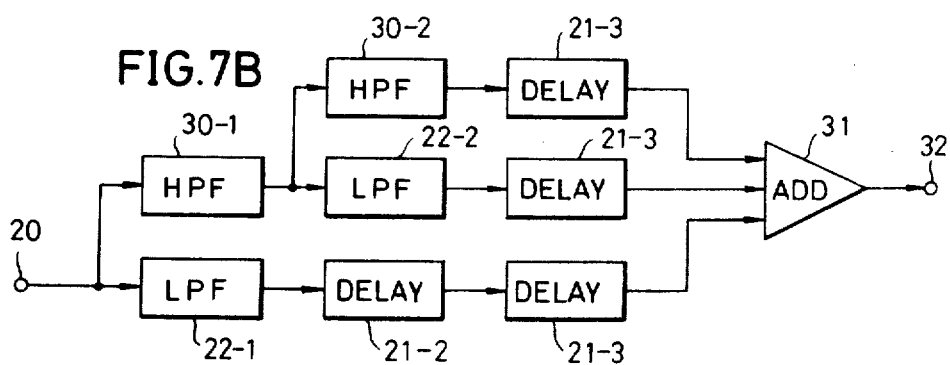
Figure 7C:
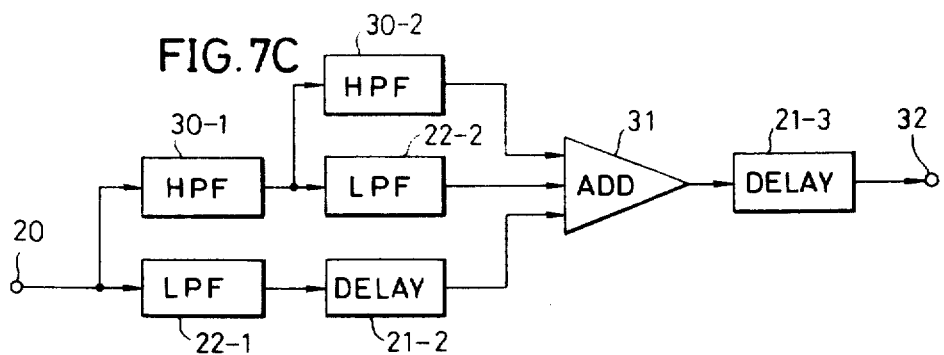
Figure 7D:
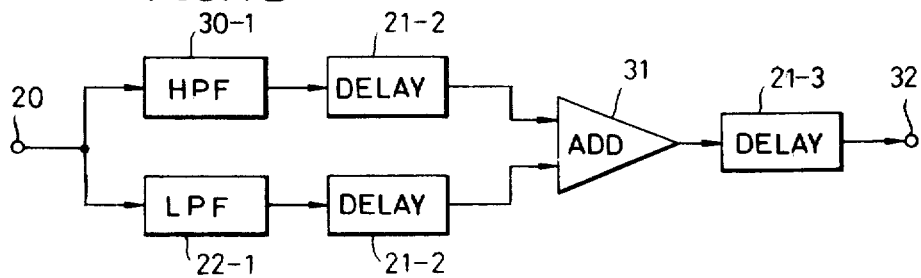
Figure 7E:
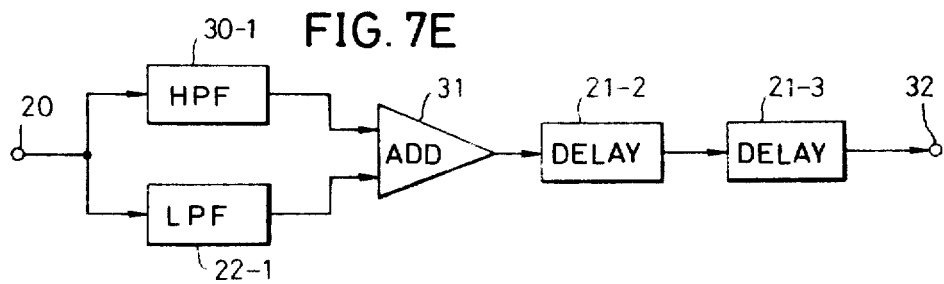

In FIG. 7B, the three delay circuits 21-3 can be abridged into a single delay circuit 21-3 as a common delay circuit, and the block system of FIG. 7B can be represented equivalently as shown in FIG. 7C. In FIG. 7C, when the characteristic (D2 − LP2) of the high-pass filter 30-2 and the characteristic LP2 of the low-pass filter 22-2 are added, the sum is D2, which is the characteristic of the delay circuit 21-2. Accordingly, the block system of FIG. 7C can be represented equivalently as in FIG. 7D. Here, the delay circuits 21-2 can be made into a common delay circuit, and the block system of FIG. 7D can be equivalently represented as in FIG. 7E.

Similarly, when the characteristic (D1 − LP1) of the high-pass filter 30-1 and the characteristic LP1 of the low-pass filter 22-1 are added, the result is the characteristic D1 of the delay circuit 21-1. Accordingly, the block system of FIG. 7E can be equivalently represented as in FIG. 7F.

Figure 7F:
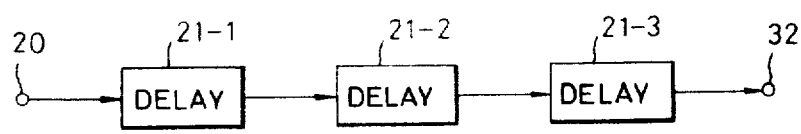

Therefore, the combined signal of the output signals of the block system of FIG. 6 becomes equivalently the same as a signal which has passed through the block system of FIG. 7F, that is, a cascade connection of delay circuits of flat amplitude and group delay characteristics. Accordingly, low-pass filters of amply steep cut-off characteristics can be used for the low-pass filters 22-1, 22-2, and 22-3. Moreover, by combining all output signals, a combined signal wherein the amplitude and group delay characteristics are both flat can be obtained.

The above described relationships and results may be analytically considered by calculation as follows. In FIG. 6, the transmission characteristic H from the input terminal 20 to the output terminal 27 is as follows.

$$H = (D1 - LP1) \cdot (D2 - LP2) \cdot (D3 - LP3) \quad (1)$$

The transmission characteristic HM from the input terminal 20 to the output terminal 26 is as follows.

$$HM = (D1 - LP1) \cdot (D2 - LP2) \cdot LP3 \quad (2)$$

The transmission characteristic LM from the input terminal 20 to the output terminal 25 is as follows.

$$LM = (D1 - LP1) \cdot LP2 \cdot D3 \quad (3)$$

The transmission characteristic L from the input terminal 20 to the output terminal 23 is as follows.

$$L = LP1 \cdot D2 \cdot D3 \quad (4)$$

Then, when Eq. (1) and Eq. (2) are added, the following equation is obtained.

$$H + HM = (D1 - LP1) \cdot (D2 - LP2) \cdot D3 = (D1 - LP1) \cdot (D2 \cdot D3 - LP2 \cdot D3) \quad (5)$$

By adding Eqs. (3) and (5), the following equation is obtained.

$$H + HM + LM = (D1 - LP1) \cdot D2 \cdot D3 = D1 \cdot D2 \cdot D3 - LP1 \cdot D2 \cdot D3 \quad (6)$$

By adding Eqs. (6) and (4), the following equation is obtained.

$$H + HM + LM + L = D1 \cdot D2 \cdot D3 \quad (7)$$

Accordingly, similarly as described above in conection with the above described equivalent circuits, the characteristics of the combined signal become the same as the amplitude and group delay characteristics of a circuit comprising the delay circuits 21-1, 21-2, and 21-3 connected in cascade arrangement.

Figure 8:
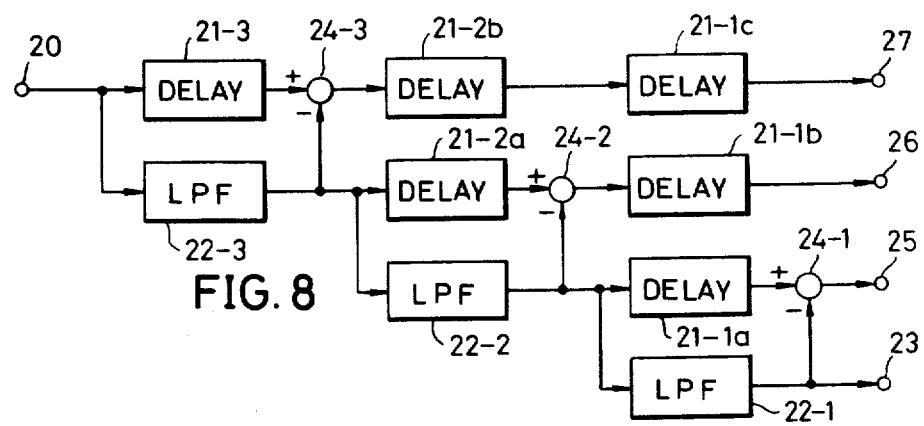
FIG. 8 is a schematic block diagram showing the general organization of a second embodiment of the frequency band dividing filter according to the invention.

A second embodiment of the frequency band dividing filter according to the invention will be described below with reference to FIG. 8 showing a block schematic diagram of this embodiment. In FIG. 8, those parts which are the same as corresponding parts in FIG. 6 are designated by like reference numerals. Description of such parts will not be repeated.

A portion of an input signal introduced through the input terminal 20 passes through and is filtered by low-pass filters 22-3, 22-2, and 22-1 to become a low band signal which is led out through the output terminal 23. The output signal of the low-pass filter 22-2 which has passed through the delay circuit 21-1a and a signal resulting from phase inversion of the output of the low-pass filter 22-1 are added in the adder 24-1, and the resulting medium-low band signal is led out through the output terminal 25. The output signal of the low-pass filter 22-3 which has passed through the delay circuit 21-2a and a signal resulting from the phase inversion of the output of the low-pass filter 22-2 are added in the adder 24-2. The output medium-high band signal of the adder 24-2 passes through the supplemental delay circuit 21-1b and is led out through the output terminal 26. A signal from the input terminal 20 which has passed through the delay circuit 21-3 and a circuit resulting from phase inversion of the output of the low-pass filter 22-3 are added in the adder 24-3. The resulting output high band signal of the adder 24-3 passes through the supplemental delay circuit 21-2b and 21-1c and is led out through the output terminal 27.

The highly desirable nature of the characteristics of the instant embodiment of the invention, which is similar to that of the preceding embodiment, will not be described since it will be evident from an understanding of the preceding embodiment.

Figure 9:
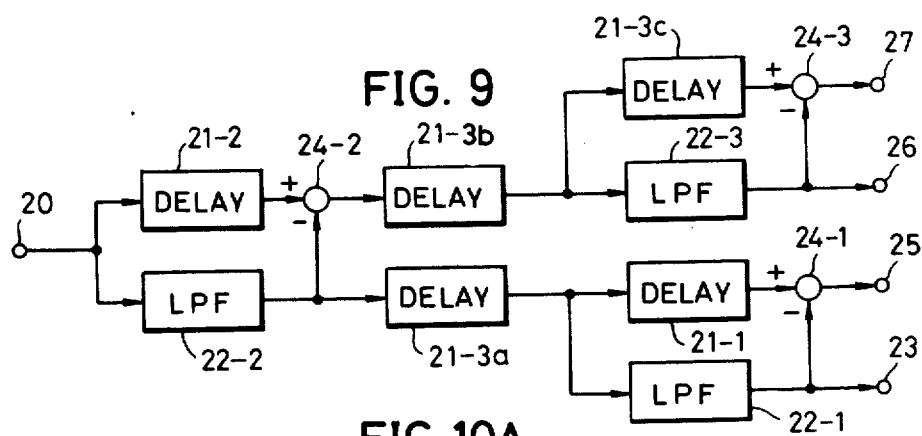
FIG. 9 is a schematic block diagram showing the general organization of a third embodiment of the frequency band dividing filter according to the invention.

A third embodiment of the invention is illustrated in the form of a block diagram in FIg. 9. In FIG. 9, those parts which the same as corresponding parts in FIG. 6 are designated by like reference numerals. Description of such parts will be omitted. An input signal introduced through the input terminal 20 is passed on one hand through the low-pass filter 22-2, the supplemental delay circuit 21-3a, and the low-pass filter 22-1, and the resulting low-band signal is led out through the output terminal 23. The signal from the low-pass filter 22-2 and the delay circuit 21-3a which has passed through the delay circuit 21-1 and the phase inverted output signal of the low-pass filter 22-1 are added in the adder 24-1, and the resulting medium-low band signal is led out through the output terminal 25. The input signal from the input terminal 20, which, on the other hand, has passed through the delay circuit 21-2 and the phase inverted output signal of the low-pass filter 22-2 are added in the adder 24-2. The resulting output of this adder 24-2, on one hand, is passed through the supplemental delay circuit 21-3b and the low-pass filter 22-3 and led out as a medium-high band signal through the output terminal 26. The signal from the adder 24-2 and the delay circuit 21-3b which has passed through the delay circuit 21-3c and the phase inverted output signal of the low-pass filter 22-3 are added in the adder 24-3, and the resulting high band signal is led out through the output terminal 27.

Figure 10A:
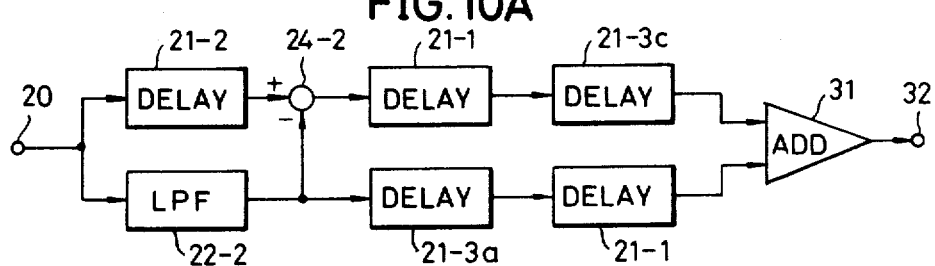
FIGS. 10A, 10B and 10C are schematic block diagrams of equivalent block organizations of the block system of FIG. 9.
Figure 10B:
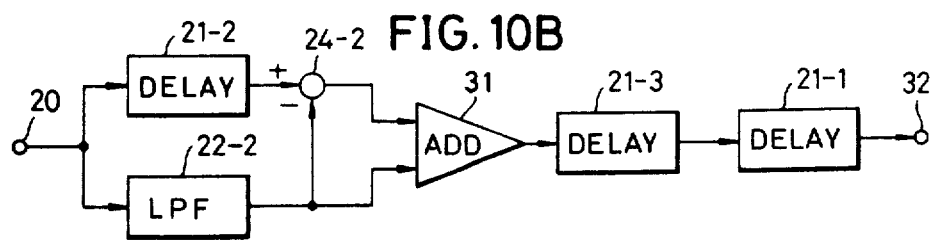
Figure 10C:
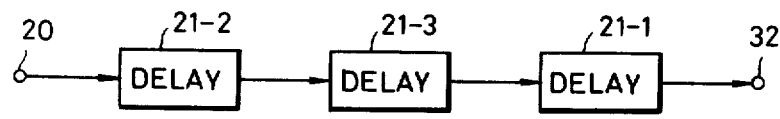

The amplitude and group delay characteristics of a signal obtained by combining the output signals from the output terminals 23, 25, 26 and 27 will be described. As was described hereinbefore in conjunction with FIGS. 7A through 7F, the characteristic after combining of the frequency band dividing filter for division into two bands, which comprises the low-pass filter 22-3 and the delay circuit 21-3c, is D1, and the characteristic after combining of the frequency band dividing filter for division into two bands, which comprises the low-pass filter 22-1 and the delay circuit 21-1, is D3. Accordingly, the combined signal of the output signals of the block system shown in FIG. 9, becomes equivalently the output signal of the block system shown in FIG. 10A. In FIG. 10A, since the delay circuit 21-1 and 21-3 are commonly used, when they are provided after the adder, the block system of FIG. 10A becomes equivalently as shown in FIG. 10B. Furthermore, the characteristic after combining of the frequency band dividing filter for division into two bands which comprises the low-pass filter 22-2 and the delay circuit 21-2, is D2. Accordingly, the block system in FIG. 10B becomes equivalently as shown in FIG. 10C. It is to be noted that the block system of FIG. 10C is equivalently the same as the block system of FIG. 7F. Therefore, the amplitude and group delay characteristics after combining are both flat.

Figure 11:
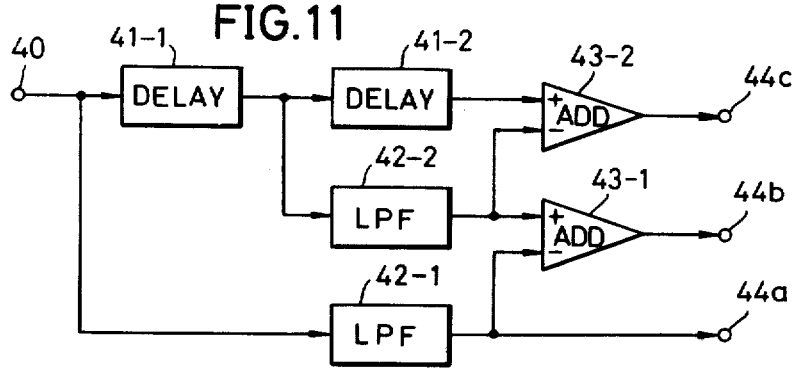

In a fourth embodiment of the frequency band dividing filter according to the invention as illustrated in FIG. 11, an input signal applied to an input terminal 40 is supplied to a delay circuit 41-1 and a low-pass filter 42-1. The resulting low band signal filtered by the low-pass filter 42-1 is led out through an output terminal 44a. The output signal of the delay circuit 41-1 is supplied, on one hand, through a low pass filter 42-2 respectively to the non-inversion input terminal of an operational circuit 43-1 and to the inversion input terminal of an operational circuit 43-2. The output of the low-pass filter 42-1 is supplied to the inversion input terminal of the operational circuit 43-1, where it is subjected resultantly to subtraction with the output of the low-pass filter 42-2. The resulting output of the operational circuit 43-1 is led out as an output medium band signal through an output terminal 44b. The output of the delay circuit 41-1, on the other hand, is passed through a delay circuit 41-2 and supplied to the non-inversion input terminal of the operational circuit 43-2. The output of the low-pass filter 42-2, on the other hand, is supplied to the inversion input terminal of the operational circuit 43-2, where it is subjected resultantly to subtraction with the output of the delay circuit 41-2. The resulting output of the operational circuit 43-2 is led out as an output high band signal through an output terminal 44c.

Then, when the characteristics of the low-pass filters 42-1 and 42-2 are denoted by LP1 and LP2, and the characteristics of the delay circuits 41-1 and 41-2 are denoted by D1 and D2, the transmission characteristics H, M, and L respectively from the input terminal 40 to the three output terminals 44c, 44b, and 44a are as follows.

$$H = D1 \cdot (D2 - LP2) = D1 \cdot D2 - D1 \cdot LP2$$

$$M = D1 \cdot LP2 - LP1$$

$$L = LP1$$

Accordingly, the characteristic of the combination of the outputs of all three output terminals 44a, 44b, and 44c becomes as follows.

$$H + M + L = D1 \cdot D2 - D1 \cdot LP2 + D1 \cdot LP2 - LP1 + LP1 = D1 \cdot D2$$

Thus, this combined characteristic becomes the same as that of merely a cascade connection of the delay circuits 41-1 and 41-2, unrelatedly to the characteristic of the two low-pass filters. For this reason, low-pass filters of steep cut-off characteristics can be used, and, furthermore, flat amplitude and group delay characteristics after combining are obtained.

The circuit organization of the high-pass side in this case corresponds to that wherein the delay circuit 41-1 is connected in cascade connection with the high-pass side of the block system illustrated in FIG. 3. By setting the amplitude and phase characteristics of the delay circuit 41-2 substantially equal to the amplitude and phase characteristics in the pass band of the low-pass filter 42-2, a high-pass filter of steep cut-off characteristic is obtained. When the delay circuit 41-1 of flat amplitude characteristic is connected in cascade arrangement with a high-pass filter of this character, there is no effect on the various characteristics.

The circuit organization on the band-pass side is equivalent to a cascade connection of the delay circuit 41-1 and the low-pass filter 42-2 from which the low-pass filter 42-1 has been deleted. Therefore, by making equal the amplitude and phase characteristics of the cascade connection of the delay circuit 41-1 and the low-pass filter 42-2 and amplitude and phase characteristics of the low-pass filter 42-1, the cut-off characteristic of the low-pass side of the band pass characteristic can be made steep similarly as on the high-pass side in the case of division into two bands. On the other hand, on the high-pass side of the band pass, both of the outputs of the low-pass filters 42-1 and 42-2 decrease, and the output after subtraction thereof will naturally decrease. Therefore, when low-pass filters of steep cut-off characteristics are used for the two low-pass filters 42-1 and 42-2, the cut-off characteristic on the high-pass side of the band-pass characteristic also becomes steep.

Since the characteristics of the low-pass side are the characteristics per se of the low-pass filter 42-1, a steep cut-off characteristic is obtained.

Figure 12:
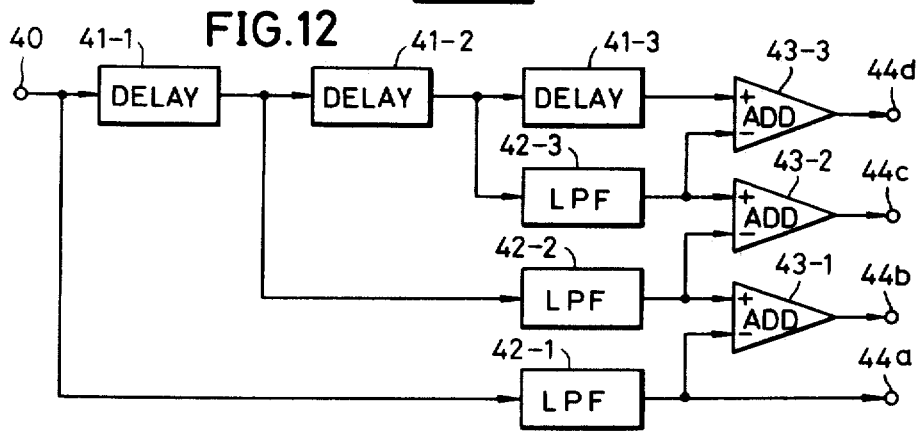

A fifth embodiment of the frequency band dividing filter according to the invention will now be described in conjunction with FIG. 12. In FIG. 12, those parts which are the same as corresponding parts in FIG. 11 are designated by like reference numerals. Description of such parts will not be repeated. A low band signal and a medium-low band signal are led out respectively from the output terminals 44a and 44b. The output of a low-pass filter 42-3 supplied to the non-inversion input terminal of the adder 43-2 and the output of the low-pass filter 42-2 supplied to the inversion input terminal thereof are subjected, in actuality, to subtraction in the adder 43-2, and the resulting output medium-high band signal is led out through the output terminal 44c. The output of the delay circuit 41-3 and the output of the low-pass filter 42-3 are respectively supplied to the non-inversion and inversion input terminals of an adder 43-3 and there subjected, in actuality, to subtraction. The resulting output high band signal is led out through an output terminal 44d.

When the characteristics of the low-pass filters 42-1, 42-2, and 42-3 are respectively denoted by LP1, LP2, and LP3 and the characteristics of the delay circuits 41-1, 41-2, and 41-3 are respectively denoted by D1, D2 and D3, the transmission characteristics from the input terminal 40 to the four output terminals are as follows. The characteristic from the input terminal 40 to the output terminal 44d is $$D1 \cdot D2 \cdot (D3 - LP3) = D1 \cdot D2 \cdot D3 - D1 \cdot D2 \cdot LP3.$$

The characteristic from the input terminal 40 to the output terminal 44c is $$D1 \cdot (D2 \cdot LP3 - LP2) = D1 \cdot D2 \cdot LP3 - D1 \cdot LP2.$$

The characteristic from the input terminal 40 to the output terminal 44b is $$D1 \cdot LP2 - LP1.$$

The characteristic from the input terminal 40 to the output terminal 44a is $$LP1.$$

Accordingly, when the outputs of all output terminals 44a through 44d are added, the following sum is obtained.

$$D1 \cdot D2 \cdot D3 - D1 \cdot D2 \cdot LP3 + D1 \cdot D2 \cdot LP3 - D1 \cdot LP2$$
$$+ D1 \cdot LP2 - LP1 + LP1 = D1 \cdot D2 \cdot D3$$

This result is equal to that of a cascade connection of three delay circuits of the characteristics D1, D2 and D3 and is unrelated to the characteristics of the low-pass filters. Therefore, the cut-off characteristic can be made steep, and, moreover, the amplitude and group delay characteristics can be made flat.

The amplitude and phase characteristics of a cascade connection of the delay circuit 41-1 and the low-pass filter 42-2 are substantially equal to those in the pass band of the low-pass filter 42-1. The amplitude and phase characteristics of a cascade connection of the delay circuit 41-2 and the low-pass filter 42-3 are substantially equal to those in the pass band of the low-pass filter 42-2. The amplitude and phase characteristics of the delay circuit 41-3 are substantially equal to those in the pass band of the low-pass filter 42-3. The amplitude and phase characteristics of a cascade connection of all three delay circuits 41-1, 41-2, and 41-3 are substantially equal to those in the pass band of the low-pass filter 42-1 of the narrowest pass band.

Accordingly, as will be apparent from a comparison of FIGS. 6 and 12, a smaller number of delay circuits is sufficient in the instant embodiment of the invention than in the embodiment illustrated in FIG. 6. The total of the delay times of the necessary delay circuits is determined by the phase characteristic in the pass band of the low-pass filter of the narrowest pass band. This is equal to the characteristic of the delay circuit 21-1 in FIG. 6 and is much superior also on the point of the total of the delay times of the necessary delay circuits.

The embodiments illustrated in FIGS. 11 and 12 are those wherein divisions are carried out respectively into bands of three channels and four channels. In the case where division into n channels is to be accomplished, a block system as shown in FIG. 13 can be used. The circuit organization, operation, characteristics, and other features of this filter can be readily understood from the above described embodiments of the invention illustrated in FIGS. 11 and 12 and, therefore, will not be described.

In each of the above described embodiment of the invention the cut-off frequencies of the various low-pass filters are, of course, mutually different thereby to pass signals of respectively different specific bands. For example, the cut-off frequencies f1, f2 and f3 of the low-pass filters 22-1, 22-2, and 22-3 in FIGS. 6, 8 and 9 have the mutual relation $f1 < f2 < f3$. The same applies also to the embodiments of the invention illustrated in FIGS. 11, 12, 13.

For the delay circuits in the filter of the present invention, circuits of the charge coupled device (CCD) or backet brigade device (BBD) type which can delay analog voltages as they are may be used. Alternatively, digital shift registers may be used. In the case where these shift registers are used, it is necessary to effect analog to digital (A-D) conversion of the front stage thereof and digital to analog (D-A) conversion of the after stage thereof. Furthermore, as long as the group delay characteristic of a circuit is flat in the band of its use (approximately 20 Hz to 20 KHz in the case of an audio signal), it can be considered to be, substantially, a delay circuit. For this reason, a circuit comprising a combination of phase-shift circuits or high-order low-pass filters of amply high cut-off frequencies may be used as the delay circuits.

In each of the preceding embodiments of the invention the amplitude characteristic and phase characteristic of each delay circuit in the pass band of the corresponding low-pass filter have been described as being equal, in theoretical principle, respectively to the amplitude characteristic and phase characteristic of the low-pass filter. In actual practice, however, it is difficult to set the above described amplitude and phase characteristics of each delay circuit to coincide exactly with those of the low-pass filter. This problem has been solved in the following embodiments of the invention.

First, when the phase characteristic is considered, it is most desirable that the phase characteristic of the delay circuit be equal to the phase characteristic of the low-pass filter over the entire frequency band thereof. However, for practical use, satisfactory results can be obtained if the phase characteristic of the delay circuit is equal to the phase characteristic of the low-pass filter in its pass band and in the vicinity of its cut-off frequency (substantially coincident with the cross-over frequency as a frequency band dividing filter). However, even in this case, it is difficult to cause the two phase characteristics to be equal. This problem has been solved by the present invention in a further embodiment thereof as described below in conjunction with FIGS. 14 through 18.

Figure 14:
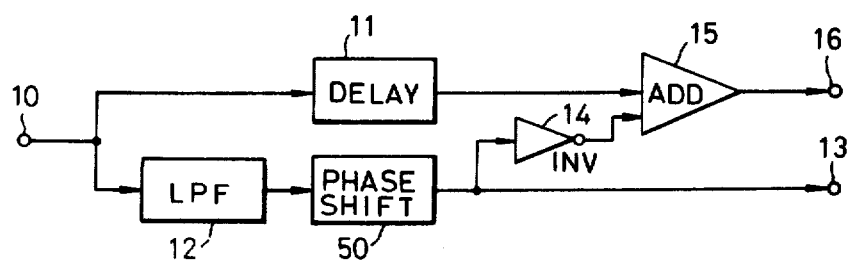
FIG. 14 is a schematic block diagram showing the general organization of a seventh embodiment of the frequency band dividing filter according to the invention.

In FIG. 14, those parts which are the same as corresponding parts in FIG. 3 are designated by like reference numerals, and detailed description of such parts will not be repeated. A signal of a specific frequency band which has been filtered by the low-pass filter 12 is phase shifted by a phase-shifting circuit 50. The signal thus phase shifted is, on one hand, led out as an output low band signal through the output terminal 13 and, on the other hand, is supplied to the adder 15 through the inverter 14. In all other respects, the circuit organization shown in FIG. 14 is the same as that illustrated in FIG. 3.

Here, the characteristic LP of the low-pass filter 12 is set at $LP = 1/(1 + T_{1s})^2$ (where $T_1 = \frac{1}{2\pi f_c}$) with a cut-off frequency $f_c$ of 1 KHz. Its amplitude characteristic G(LP) and phase characteristic P(LP) are as indicated by curves I and II, respectively, in FIG. 15, from which this low-pass filter 12 can be said to have a relatively good cut-off characteristic. The amplitude characteristic G(D) and phase characteristic P(D) of the delay circuit 11 are respectively as indicated by a straight line III and a curve IV in FIG. 15. For example, the delay time of the delay circuit 11 is 350 μs. and its gain is 0 dB.

The characteristic PS of the phase-shifting circuit 50 is set as $PS = (1 - \xi T_{2s})^2/(1 + \xi T_{2s})^2$ (where $T_2 = T_1/2.5, \xi = 0.3$). The amplitude characteristic G(PS) and phase characteristic P(PS) of the phase-shifting circuit 50 are respectively as indicated by the straight line III and curve V in FIG. 15. The characteristics of this phase-shifting circuit 50 are so set that the amplitude characteristic G(LP + PS) as indicated by a curve I in FIG. 15 and the phase characteristic P(LP + PS) as indicated by a curve VI in the same figure of a circuit formed by a cascade connection of the low-pass filter 12 and the phase-shifting circuit 50 will be substantially equal respectively to the amplitude characteristic G(D) as indicated by the straight line III in FIG. 15 and the phase characteristic P(D) as indicated by the curve IV in the same figure of the delay circuit 11 in the pass band and in the vicinity of the cut-off frequency (1 KHz) of the low-pass filter 12.

As will be apparent from a comparison of the curve II in FIG. 15 indicating the phase characteristic P(LP) of the low-pass filter 12 and the curve VI indicating the phase characteristic P(LP + PS) of the circuit formed by the cascade connection of the low-pass filter 12 and the phase-shifting circuit 50, the phase characteristic of this cascade connection circuit of the low-pass filter 12 and the phase-shifting circuit 50 is closer to the phase characteristic P(D) of the delay circuit 11 as indicated by the curve IV than that of only the low-pass filter 12 in the pass band and in the vicinity of the cut-off frequency of the low-pass filter 12.

Accordingly, even when the phase characteristic of the low-pass filter 12 is a characteristic as indicated by the curve II, by cascade connecting the phase-shifting circuit 50 therewith, the characteristic indicated by the curve VI which is closed to the phase characteristic indicated by the curve IV of the delay circuit 11 is obtained. For this reason, the output signal of the delay circuit 11 and the output signal of the inverter 14 are mutually of substantially opposite phase, and good operation is carried out in the operation circuit 15.

Figure 16:
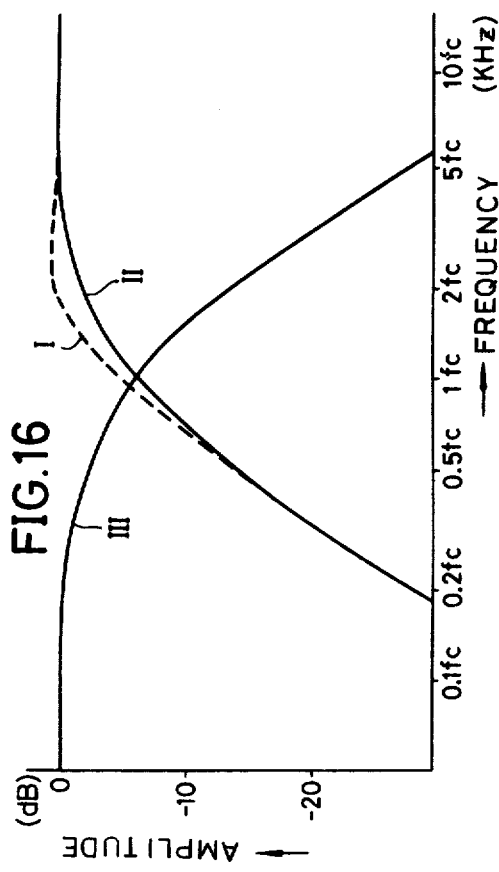
FIG. 16 is a graph indicating the amplitude characteristics of the frequency band dividing filters illustrated in FIGS. 3 and 14.

As a result, the amplitude characteristic of the high band output signal obtained at the output terminal 16 shown in FIG. 14 becomes as indicated by the curve II in FIG. 16. As will be apparent from a comparison of this amplitude characteristic indicated by the curve II with the amplitude characteristic (curve IIIH in FIG. 5) of the high band output signal of the circuit shown in FIG. 3 indicated by the curve I in FIG. 15, the cut-off characteristic is improved. The curve III in FIG. 16 indicates the amplitude characteristic of the low band output signal obtained at the output terminal 13.

Furthermore, when the output signals of the output terminals 13 and 16 are combined, the characteristic of the combined signal becomes LP · PS + D − LP · PS = D (where PS is the characteristic of the phase-shifting circuit), and, similarly as in the embodiment of the invention illustrated in FIG. 3, the characteristic of this combined signal is expressed by only the characteristic D of the delay circuit 11 whose amplitude characteristic and delay characteristic are both flat and is unrelated to the characteristics LP and PS of the low-pass filter 12 and the phase-shifting circuit 50.

Figure 17:
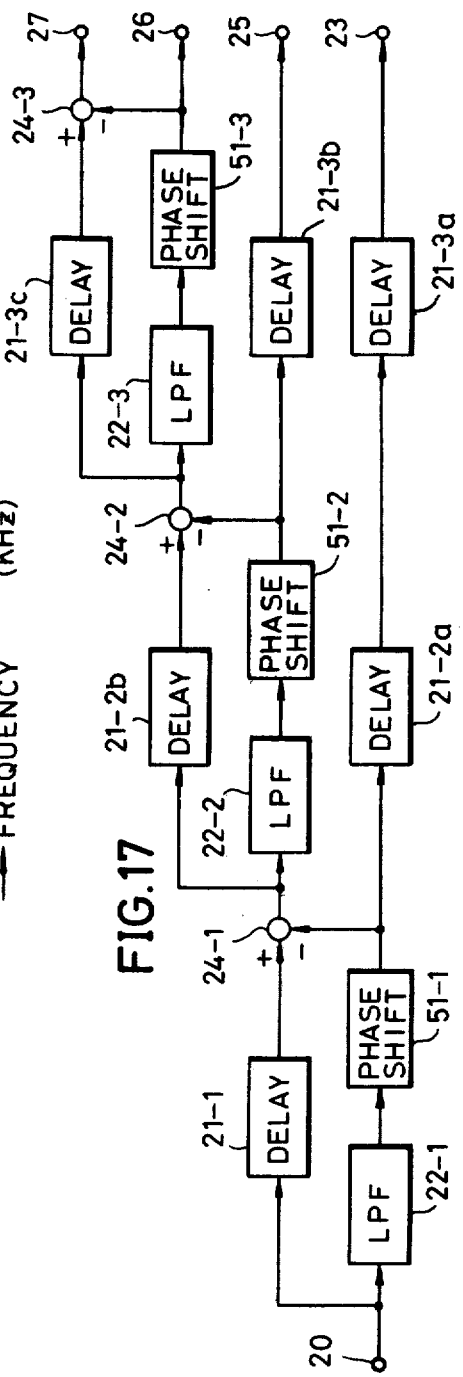

Embodiments of the invention which evolve when the above considerations are applied to the embodiments illustrated in FIGS. 6 and 11 are shown in FIGS. 17 and 18. In FIGS. 17 and 18, those parts which are the same as corresponding parts in FIGS. 6 and 11 are designated by like reference numerals, and detailed description of such parts will be omitted.

In the arrangement illustrated in FIG. 17, phase-shifting circuits 51-1, 51-2, and 51-3 are cascade connected to low-pass filters 22-1, 22-2, and 22-3. It is not necessary to connect a phase shifting circuit to every low-pass filter, and a circuit organization wherein a phase-shifting circuit is cascade connected to the corresponding low-pass filter in only each band system in which it is necessary to obtain a particularly sharp cut-off characteristic may be used.

In the circuit shown in FIG. 18, phase-shifting circuits 52-1 and 52-2 are cascade connected to the low-pass filters 42-1 and 42-2. Here the characteristic PS2 of the phase-shifting circuit 52-2 is so set that the amplitude characteristic (indicated by the curve I in FIG. 15) and the phase characteristic (indicated by the curve VI in the same figure) of the cascade connected circuit of the low-pass filter 42-2 and the phase-shifting circuit 52-2 will be substantially equal to the amplitude characteristic (indicated by the straight line III) and the phase characteristic (indicated by the curve IV) of the delay circuit 41-2 in the pass band and the vicinity of the cut-off frequency (only the pass band with respect to the amplitude characteristic) of the low-pass filter 42-2 of which amplitude and phase characteristics are indicated respectively by the curves I and II in FIG. 15.

Furthermore, the characteristic PS1 of the phase-shifting circuit 52-1 is so set that the amplitude and phase characteristics of the cascade connected circuit of the low-pass filter 42-1 and phase shifting circuit 52-1 will be substantially equal to the amplitude and phase characteristics of the cascade connection circuit of the delay circuit 41-1, low-pass filter 42-2, and phase-shifting circuit 52-2 in the pass band and vicinity of the cut-off frequency (only the pass band with respect to the amplitude characteristic) of the low-pass filter 42-1.

When the signals led out through the output terminals 23, 25, 26, and 27 are combined, the characteristic of the combined signal becomes $LP1 \cdot PS1 + D1 \cdot LP2 \cdot PS2 - LP1 \cdot PS1 + D1 \cdot D2 - D1 \cdot LP2 \cdot PS2 = D1 \cdot D2$. Accordingly, the characteristic of the combined signal is represented by only the characteristics D1 and D2 of the delay circuits 41-1 and 41-2 and is unrelated to the characteristics LP1, LP2, PS1, and PS2 of the low-pass filters 42-1 and 42-2 and the phase-shifting circuits 52-1 and 52-2. Therefore, the amplitude and delay characteristics of the combined signal are both flat.

In the preceding seventh, eighth, and ninth embodiments of the invention described above in conjunction with FIGS. 14, 17, and 18, a secondary order phase-shifting circuit is cascade connectd in one stage with respect to each low-pass filter, but the arrangement is not thus limited. Depending on the purpose, a phase-shifting circuit of higher order may be used, and phase-shifting circuits may be cascade connected in a plurality of stages. Furthermore, either a low-pass filter or its corresponding phase-shifting circuit may be disposed in front in sequence in their cascade connection. The phase-shifting circuit may be connected in a signal transmission path including the low-pass filter.

Here, in order to obtain a flat amplitude characteristic by combining directly as they are the outputs of all bands of the frequency band dividing filter, the levels of these outputs must be so set. In actual practice, however, since a level adjuster is used so as to unify the levels of the amplifiers and speakers of different amplitude characteristic connected in the later stages of the frequency band dividing filter, there is essentially no problem even when, for example, the output levels of all bands of this filter are different.

In addition, even when there is an output of opposite polarity (opposite phase) among the outputs of the respective bands, this, also, is essentially no problem since the phase can be easily reinverted by the connections of components such as amplifiers and speakers.

Since there is essentially no problem even when the levels of the outputs of the bands are different, the amplitude and phase characteristics need not be equal in all bands, the only requirement being that only the phase characteristics be equal. For example, in the embodiment of the invention illustrated in FIG. 17, the only requirement is that the phase characteristics of the delay circuits 21-2a and 21-2b be equal, and the phase characteristics of the delay circuits 21-3a, 21-3b, and 21-3c be equal.

Furthermore, while the amplitude characteristic in the pass band of the low-pass filter can be easily set at 0 dB, in a delay circuit wherein a bucket brigade device (BBD), for example, is used, the amplitude characteristic in the pass band is minus a number of dB, and in a delay circuit wherein a low-pass filter of higher order of constant K-type is used, the amplitude characteristic does not become greater than −6 dB. Consequently, it is difficult to set the amplitude characteristic of the delay circuit equal to that in the pass band of the low-pass filter.

This problem is solved in still another embodiment of the invention as described below. The delay circuit 11 shown in FIG. 19 comprises an ideal low-pass filter of constant K-type wherein the amplitude characteristic is set at substantially 0.5 (−6 dB). The amplitude characteristic of the low-pass filter 12 in its pass band is set at substantially 1 (0 dB). A signal passing through the low-pass filter 12 is led out as a low band output signal through the output terminal 13 and, at the same time, is supplied to a coefficient applying operation circuit 60, where it is multiplied by a coefficient K2, then being applied to an operational amplifier 61. On the other hand, a signal from the delay circuit 11 is multiplied by a coefficient K1 and then applied to the operational amplifier 61, where it is added to the above mentioned signal from the low-pass filter 12 which has been multiplied by the coefficient K2. Here, these coefficients K1 and K2 are set at K1 = 2 and K2 = −1. Accordingly, the signals from the delay circuit 11 and the low-pass filter 12 of amplitude characteristics which are unequal with each other are subjected to have equal amplitude characteristics by applying the coefficients and subtracted in the operational amplifier 61 as signals of mutually substantially the same phase and the same level in the pass band of the low-pass filter 12. Therefore, a high band output of sharp cut-off characteristic is led out through the output terminal 16.

In this case, a sharp cut-off characteristic of the high band output can be obtained if the output of the operation circuit 60 is sufficiently low in the pass band of the low-pass filter 12. For this purpose, the coefficients K1 and K2 need not be of the values set forth above but may be of values in combinations such as, for example, K1 = 1, K2 = 0.5 or K1 = −2, K2 = 1, provided that the following equation is satisfied.

$$\frac{K1}{K2} = \frac{\text{(amplitude characteristic of the low-pass filter in the pass band thereof)}}{\text{(amplitude characteristic of the delay circuit in the pass band of the low-pass filter)}}$$

The above mentioned coefficient operation circuit 60 in actual practice comprises, for example, a combination of an operational amplifier 62 and resistors R1 through R4 as shown in FIG. 20A. The input terminals 63 and 64 are respectively connected through resistors R1 and R3 to the inverting input terminal and the noninverting input terminal of the operational amplifier 62. A resistor R2 is connected between the output terminal and the inverting input terminal of the operational amplifier 62, and the noninverting input terminal thereof is connected through a resistor R4 to ground (earth). An input to be multiplied by a negative coefficient is supplied into this circuit through an input terminal 63, while an input to be multiplied by a positive coefficient is supplied through an input terminal 64.

In the case where a circuit organization wherein, in the pass band of the low-pass filter, the low-pass filter and the delay circuit are of mutually opposite polarity (opposite phase)(in which state, although it may be considered that the phase characteristics are different, it will be assumed here that the phase characteristics are substantially equal, and one of the amplitude characteristics is negative) is used, a circuit as shown in FIG. 20B may be used for the operation circuit 60. In the same figure, the input terminals 63 and 64 are respectively connected via resistors R5 and R6 to the inverting input terminal of the operational amplifier 62. A resistor R7 is connected between the output terminal and the inverting input terminal of the operational amplifier 62, and the noninverting input terminal thereof is connected directly to ground (earth). In this case, the signals entering through the terminals 63 and 64 are both multiplied by negative coefficients and then added.

A further embodiment of the invention which is formed by using the circuit shown in FIG. 19 as a two-band dividing basic unit circuit and applying this circuit to a filter of a three-band dividing organization based on the embodiments of the invention illustrated in FIGS. 3, 6, 11, etc., will now be described with reference to FIGS. 21 through 25. In FIGS. 21 through 25, those parts which are the same as corresponding parts in FIGS. 6 and 11 are designated by like reference numerals, and detailed description of such parts will be omitted.

In FIG. 21, a two-band dividing basic unit circuit 70 comprising a delay circuit 21-1, a low-pass filter 22-1, and an adder 24-1 is similar to those illustrated in FIGS. 3 and 6. A basic unit circuit 71 for two-band dividing the output signal of the adder 24-1 is of a circuit organization similar to that shown in FIG. 19, and comprises a delay circuit 21-2$b$, a low-pass filter 22-2, and a coefficient applying operation circuit 60. Output signals of low band, medium band, and high band are led out respectively from the output terminals 72$a$, 72$b$, and 72$c$.

In accordance with the present embodiment of the invention, in order to obtain a good cut-off characteristic in the high band, it is not necessary to set the amplitude characteristic of the delay circuit 21-2$b$ substantially equal to the amplitude characteristic of the low-pass filter 22-2 in the pass band of the low-pass filter 22-2, the only requirement being merely that the phase characteristics be equal, whereby the design and production are facilitated.

As a modification of the embodiment of the invention shown in FIG. 21, the basic unit circuit 70 and 71 may be interchanged.

Figure 22:
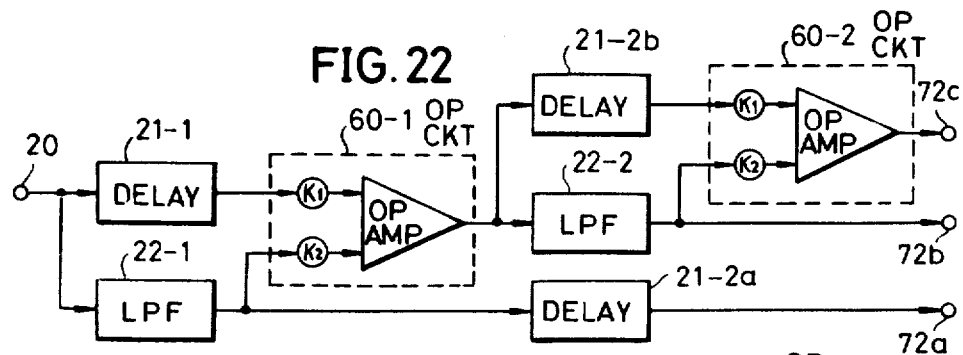

The embodiment of the invention illustrated in FIG. 22 uses a coefficient applying operation circuit 60-1 in place of the adder 24-1 in the embodiment shown in FIG. 21. According to the present embodiment of the invention, a high band output and a medium band output of good cut-off characteristics can be obtained even when the amplitude characteristics of the delay circuits 21-1 and 21-$ab$ are not equal to the amplitude characteristics of the low-pass filters 22-1 and 22-2 in the pass band thereof.

Figure 23:
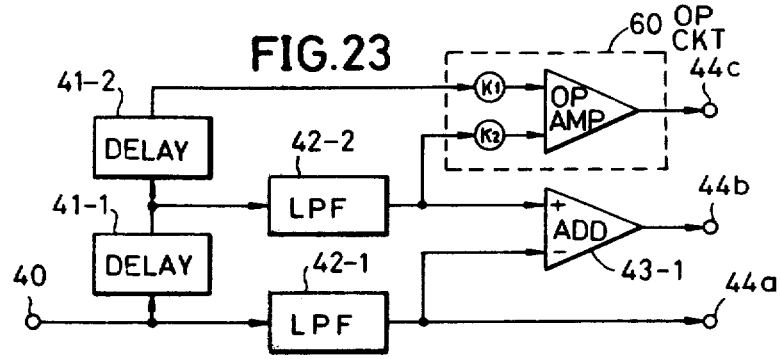
Figure 24:
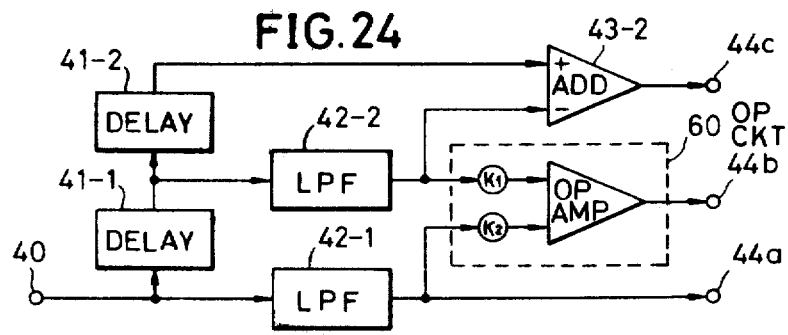
Figure 25:
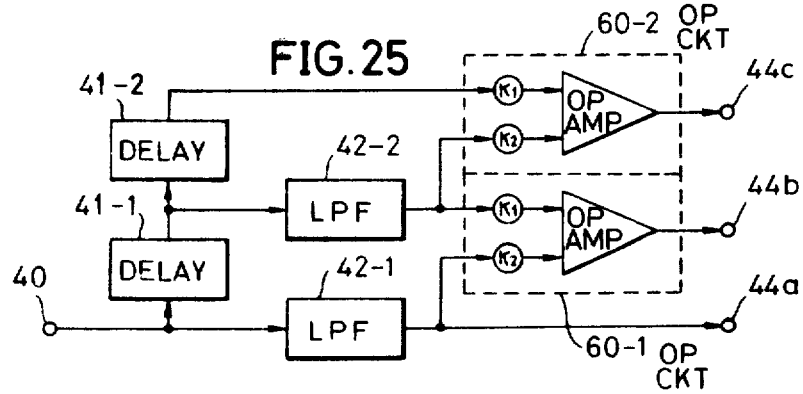

Furthermore, as shown in FIG. 23, the coefficient applying operation circuit 60 may be used in place of the adder 43-2 in the embodiment shown in FIG. 11. Otherwise, as shown in FIG. 24, the coefficient applying operation circuit 60 may be used in place of the adder 43-1 in the embodiment shown in FIG. 11. Further, as shown in FIG. 25, coefficient applying operation circuits 60-1 and 60-2 may be used in place of adders 43-1 and 43-2 in the embodiment shown in FIG. 11.

The values of the coefficients of the above mentioned coefficient applying operation circuits are not limited those in the above described embodiment of the invention. For example, the values $K1 = 1$ and $K2 = -0.5$ may be used. In this case, when the high band output signal and the low band output signal are combined, the high band side in proportion to the low band side becomes 0.5 ($-6$ dB), and the amplitude characteristic no longer is flat. In actual practice, however, there arises essentially no problem since a level adjuster is used so as to unify the high band and low band levels of amplifiers and speakers of different amplitude characteristics which are connected in the later stages of the frequency band dividing filter.

Furthermore, even when the coefficients are of mutually opposite polarity (opposite phase), such as $K1 = -2$ and $K2 = 1$, there is essentially no problem since the phases can be easily reinverted by the connections of the components such as amplifiers and speakers.

In addition, it is not necessary that both the amplitude characteristics and the phase characteristics of the delay circuit of the basic unit circuit for two-band division and of the delay circuit for compensation provided in correspondence thereto in another band signal path be equal, the only requirement being that the phase characteristics be equal.

Further, this invention is not limited to these embodiments but various variations and modifications may be made without departing from the scope of the invention.

What is claimed is:

1. A frequency band dividing filter comprising: an input terminal for application thereto of input signals; at least two unit circuits connected in cascade connection of at least two stages; and supplemental delay circuit means, each of said unit circuits comprising a low-pass filter having a specific filtering frequency band with a steep cut-off characteristic, a delay circuit connected in parallel with said low-pass filter and having a frequency phase characteristic substantially equal to the frequency phase characteristic of said low-pass filter in the pass band thereof, and a subtraction circuit connected to the output sides of said low-pass filter and said delay circuit thereby to carry out subtraction of the outputs of said low-pass filter and said delay circuit, the input sides of the low-pass filter and the delay circuit of a first stage unit circuit of said two unit circuits connected in two stage cascade connection being connected to said input terminal, the input sides of the low-pass filter and the delay circuit of a second stage unit circuit of said two unit circuits being connected to the output side of the subtraction circuit of the first stage unit circuit, said supplemental delay circuit means comprising a supplemental delay circuit having the same characteristic as the characteristic of the delay circuit of the second stage unit circuit and being connected to the output side of the low-pass filter of the first stage unit circuit.

2. A frequency band dividing filter as claimed in claim 1 in which at least one unit circuit further comprises a phase-shifting circuit connected to the low-pass filter in cascade connection in a shunted signal path including the low-pass filter.

3. A frequency band dividing filter as claimed in claim 1 in which said subtraction circuit of each of said unit circuits comprises a coefficient applying operation circuit for operating the output signals of the delay circuit and the low-pass filter with applying and multiplying the output signals by the coefficients K1 and K2.

4. A frequency band dividing filter comprising: an input terminal for application thereto of input signals; three unit circuits connected in cascade connection of three stages; and supplemental delay circuit means, each of said unit circuits comprising a low-pass filter having a specific filtering frequency band with a steep cut-off characteristic, a delay circuit connected in parallel with said low-pass filter and having a frequency phase characteristic substantially equal to the frequency phase characteristic of said low-pass filter in the pass band thereof, and a subtraction circuit connected to the output sides of said low-pass filter and said delay circuit thereby to carry out subtraction of the outputs of said low-pass filter and said delay circuit, the input sides of the low-pass filter and the delay circuit of a first stage unit circuit of said three unit circuits connected in three stage cascade connection being connected to said input terminal, the input sides of the low-pass filter and the delay circuit of a second stage unit circuit of said three unit circuits being connected to the output side of the subtraction circuit of the first stage unit circuit, the input sides of the low-pass filter and the delay circuit of the third stage unit circuit of said three unit circuits being connected to the output side of the subtraction circuit of the second stage unit circuit, said supplemental delay circuit means comprising a first supplemental delay circuit having the same characteristic as the characteristic of the delay circuit of the second stage unit circuit and being connected to the output side of the low-pass filter of the first stage unit circuit, and second and third supplemental delay circuits having respectively the same characteristics as the characteristic of the delay circuit of the third stage unit circuit and being respectively connected to the output side of the low-pass filter of the second stage unit circuit and to the output side of the first supplemental delay circuit.

5. A frequency band dividing filter comprising: an input terminal for application thereto of input signals; at least two unit circuits connected in cascade connection of at least two stages; and supplemental delay circuit means, each of said unit circuits comprising a low-pass filter having a specific filtering frequency band with a steep cut-off characteristic, a delay circuit connected in parallel with said low-pass filter and having a frequency phase characteristic substantially equal to the frequency phase characteristic of said low-pass filter in the pass band thereof, and a subtraction circuit connected to the output sides of said low-pass filter and said delay circuit thereby to carry out subtraction of the outputs of said low-pass filter and said delay circuit, the input sides of the low-pass filter and the delay circuit of a first stage unit circuit of said two unit circuits connected in two stage cascade connection being connected to said input terminal, the input sides of the low-pass filter and the delay circuit of a second stage unit circuit of said two unit circuits being connected to the output side of the low-pass filter of the first stage unit circuit, said supplemental delay circuit means comprising a supplemental delay circuit having the same characteristic as the characteristic of the delay circuit of the second stage unit circuit and being connected to the output side of the subtraction circuit of the first stage unit circuit.

6. A frequency band dividing filter as claimed in claim 5 in which at least one unit circuit further comprises a phase-shifting circuit connected to the low-pass filter in cascade connection in a shunted signal path including the low-pass filter.

7. A frequency band dividing filter as claimed in claim 5 in which said subtraction circuit of each of said unit circuits comprises a coefficient applying operation circuit for operating the output signals of the delay circuit and the low-pass filter with applying and multiplying the output signals by the coefficients K1 and K2.

8. A frequency band dividing filter comprising: an input terminal for application thereto of input signals; three unit circuits connected in cascade connection of three stages; and supplemental delay circuit means, each of said unit circuits comprising a low-pass filter having a specific filtering frequency band with a steep cut-off characteristic, a delay circuit connected in parallel with said low-pass filter and having a frequency phase characteristic substantially equal to the frequency phase characteristic of said low-pass filter in the pass band thereof, and a subtraction circuit connected to the output sides of said low-pass filter and said delay circuit thereby to carry out subtraction of the outputs of said low-pass filter and said delay circuit, the input sides of the low-pass filter and the delay circuit of a first stage unit circuit of said three unit circuits connected in three stage cascade connection being connected to said input terminal, the input sides of the low-pass filter and the delay circuit of a second stage unit circuit of said three unit circuits being connected to the output side of the low-pass filter of the first stage unit circuit, the input sides of the low-pass filter and the delay circuit of the third stage unit circuit of said three unit circuits being connected to the output side of the low-pass filter of the second stage unit circuit, said supplemental delay circuit means comprising a first supplemental delay circuit having the same characteristic as the characteristic of the delay circuit of the second stage unit circuit and being connected to the output side of the subtraction circuit of the first stage unit circuit, and second and third supplemental delay circuits having respectively the same characteristics as the characteristic of the delay circuit of the third stage unit circuit and being respectively connected to the output side of the subtraction circuit of the second stage unit circuit and to the output side of the first supplemental delay circuit.

9. A frequency band dividing filter comprising: an input terminal for application thereto of input signals; a first unit circuit connected to said input terminal; second and third unit circuits respectively connected to said first unit circuit in cascade connection; and supplemental delay circuit means, each of said unit circuits comprising a low-pass filter having a specific filtering frequency band with a steep cut-off characteristic, a delay circuit connected in parallel with said low-pass filter and having a frequency phase characteristic substantially equal to the frequency phase characteristic of said low-pass filter in the pass band thereof, and subtraction circuit connected to the output sides of said low-pass filter and said delay circuit thereby to carry out subtraction of the outputs of said low-pass filter and said delay circuit, the input sides of the low-pass filter and the delay circuit of the first unit circuit being connected to said input terminal, the input sides of the low-pass filter and the delay circuit of the second unit circuit being connected to the output side of the subtraction circuit of the first unit circuit, the input sides of the low-pass filter and the delay circuit of the third unit circuit being connected to the output side of the low-pass filter of the first unit circuit, said supplemental delay circuit means comprising a first supplemental delay circuit having the same characteristic as the characteristic of the delay circuit of the third unit circuit and being connected between the first unit circuit and the second unit circuit, and second supplemental delay circuit having the same characteristic as the characteristic of the delay circuit of the second unit circuit and being connected between the first unit circuit and the third unit circuit.

10. A frequency band dividing filter as claimed in claim 9 in which at least one unit circuit further comprises a phase-shifting circuit connected to the low-pass filter in cascade connection in a shunted signal path including the low-pass filter.

11. A frequency band dividing filter as claimed in claim 9 in which said subtraction circuit of each of said unit circuits comprises a coefficient applying operation circuit for operating the output signals of the delay circuit and the low-pass filter with applying and multiplying the output signals by the coefficients K1 and K2.

12. A frequency band dividing filter comprising: an input terminal for application thereto of input signals; a delay circuit connected to the input terminal; a low-pass filter connected in parallel with said delay circuit with respect to the input terminal and having a specific filtering frequency band with a steep cut-off characteristic; a subtraction circuit connected to the output sides of said low-pass filter and said delay circuit thereby to carry out subtraction of the outputs of said low-pass filter and said delay circuit; a phase-shifting circuit connected in a shunted signal path containing the low-pass filter between the input terminal and the subtraction circuit; a first output terminal for leading out the output low-frequency band signal of said low-pass filter; and a second output terminal for leading out the output high-frequency band signal of said subtraction circuit, the frequency phase characteristic of the cascade connection circuit of said low-pass filter and said phase-shifting circuit being equal to the frequency phase characteristic of delay circuit in the pass band of the low-pass filter.

* * * * *